(12) United States Patent
Lee

(10) Patent No.: US 6,197,691 B1
(45) Date of Patent: Mar. 6, 2001

(54) SHALLOW TRENCH ISOLATION PROCESS

(75) Inventor: James Yong Meng Lee, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/439,357

(22) Filed: Nov. 15, 1999

(51) Int. Cl.[7] .................................................. H01L 21/302
(52) U.S. Cl. ......................... 438/691; 438/692; 438/694; 438/697; 438/699; 438/700
(58) Field of Search ................................ 438/690, 692, 438/691, 694, 697, 699, 700, 702, 424

(56) References Cited

U.S. PATENT DOCUMENTS

| | | | |
|---|---|---|---|
| 5,173,439 | 12/1992 | Dash et al. ............................ | 437/67 |
| 5,498,565 | 3/1996 | Gocho et al. ......................... | 437/67 |
| 5,665,202 | 9/1997 | Subramanian et al. ............... | 438/692 |
| 5,728,621 * | 3/1998 | Zheng et al. ......................... | 438/427 |
| 5,792,707 | 8/1998 | Chung .................................. | 438/633 |
| 5,817,567 | 10/1998 | Jang et al. ............................ | 438/427 |
| 5,880,007 | 3/1999 | Varian et al. ........................ | 438/427 |
| 5,943,590 * | 8/1999 | Wang et al. .......................... | 438/427 |
| 5,958,795 * | 9/1999 | Chen et al. ........................... | 438/692 |
| 6,037,018 * | 3/2000 | Jang et al. ............................ | 427/579 |
| 6,048,775 * | 4/2000 | Yao et al. ............................. | 438/427 |
| 6,090,714 * | 7/2000 | Jang et al. ............................ | 438/692 |

* cited by examiner

*Primary Examiner*—Benjamin L. Utech
*Assistant Examiner*—Binh X Tran
(74) *Attorney, Agent, or Firm*—George O. Saile; Rosemary L. S. Pike

(57) ABSTRACT

A new method of forming shallow trench isolations has been achieved. A semiconductor substrate is provided. A first etch stop layer is deposited. The first etch stop layer and the semiconductor substrate are etched to form trenches. A gap fill layer of high density plasma oxide is deposited overlying the first etch stop layer and filling the trenches. The deposition of the gap fill layer is stopped before the planar top surface of the gap fill layer overlying the trenches reaches the level of the top surface of the first etch stop layer bordering the trenches. The gap fill layer is etched so that the gap fill layer overlying the trenches does not contact the gap fill layer overlying the first etch stop layer. A second etch stop layer is deposited. The deposition of the second etch stop layer is stopped before the planar top surface of the second etch stop layer overlying the trenches reaches the level of the top surface of the first etch stop layer. The second etch stop layer is polished down to selectively expose the gap fill layer in areas not overlying the trenches. The exposed gap fill layer is etched away. The second etch stop layer and the first etch stop layer are etched away to complete the STI.

20 Claims, 5 Drawing Sheets

SHALLOW TRENCH ISOLATION PROCESS

BACKGROUND OF THE INVENTION

(1) Field of the Invention

The invention relates to a method of fabricating semiconductor structures, and more particularly, to a method of forming shallow trench isolation structures in the manufacture of integrated circuit devices.

(2) Description of the Prior Art

Shallow trench isolation (STI) is now commonly used in the art as an alternative to local oxidation of silicon (LOCOS) for forming isolations between active device areas in the integrated circuit. STI offers the advantages of smaller isolation area and better surface planarization when compared to LOCOS.

FIG. 1 illustrates an integrated circuit device of the prior art. A semiconductor substrate 10 is shown. A polish stop layer 14 is formed overlying the semiconductor substrate 10. The polish stop layer 14 is typically comprised of silicon nitride. Trenches for shallow trench isolations have been etched through the polish stop layer 14 and into the semiconductor substrate 10.

Referring now to FIG. 2, a gap fill layer 18 is deposited overlying the polish stop layer and filling the trenches. The gap fill layer 18 is comprised of a non-conductive dielectric material. In this example, a high density plasma oxide (HDP oxide) is deposited. In a HDP oxide deposition, the process simultaneously deposits and etches the oxide material. Using this oxide results in the very good fill characteristics, such as no voids in the oxide in the trenches. In addition, the HDP oxide deposits to near 45 degree angle topologies at trench corners. In the art, the gap fill layer 18 would be deposited to a depth that will allow it to exceed the height of the etch stop layer 14 that borders the trenches by a safe amount L1.

Referring now to FIG. 3, a photoresist layer 22 is deposited overlying the gap fill layer 18. A photolithographic step is required here because it is desirable to remove the excess gap fill layer 18 in the areas outside of the trenches (that is, the active areas). The photoresist layer 18 is exposed (typically as an oversized reverse mask of the trenches) and developed to form the protective mask shown.

Referring now to FIG. 4, excess gap fill layer 18 is etched down. The photoresist layer 22 is stripped away following the etch.

Referring now to FIG. 5, the gap fill layer 18 is polished down to the top surface of the etch stop layer 14 to complete the STI structures.

There are three problems with the prior art technique. First, a photolithographic step is required. This mask step adds processing cost. Second, the gap fill layer 18 is over polished over the trenches. It is necessary to polish all of the oxide off the etch stop layer 14. To insure a complete polish, some over polishing always occurs. In the prior art case, because of the over polish, dishing 26 occurs. This dishing occurs primarily over wide trench areas and can cause excessive device leakage in some cases. Third, the final thickness L2 of the gap fill layer 18 is difficult to control. The way the process is constructed, the thickness will depend on a complex function of deposited gap fill layer 18 thickness, etch stop layer 14 thickness, the amount of etch down of the gap fill layer 18, and variation in the polishing down process.

Several prior art approaches disclose methods to form and planarize shallow trench isolations. U.S. Pat. No. 5,665,202 to Subramanian et al discloses an STI process. Trenches are formed with silicon nitride etch stops bordering. Silicon dioxide is deposited to fill the trenches above the top of the silicon nitride etch stops. A second silicon nitride layer is deposited overlying the silicon dioxide fill layer. A first polish down is performed to exposed the silicon dioxide layer. In one embodiment, a second polish down is performed to remove the exposed silicon dioxide layer down to the top surface of the first silicon nitride etch stop. In a second embodiment, the second polish down removes the silicon dioxide only down to near the top of the first silicon nitride layer. Variation in pad pressure is used to control selectivity in the chemical mechanical polish (CMP) operation. U.S. Pat. No. 5,817,567 to Jang et al teaches a STI process. After an oxide fill of the trench, a silicon nitride layer is deposited overlying the oxide layer. A CMP is performed to remove the silicon nitride and the oxide in peak areas and to planarize the topology. A single etch is used to remove both the remaining silicon nitride and a portion of the oxide. A second CMP is used to polish down the oxide to the top surface of the trench edges. U.S. Pat. No. 5,173,439 to Dash et al teaches another STI process. A polysilicon layer is deposited overlying the oxide fill layer. A CMP is performed to remove a portion of the polysilicon layer, leaving the layer overlying the oxide over the trenches. An anisotropic etch is performed to etch down the oxide layer where not covered by the polysilicon. A second CMP is performed to polish down the remaining polysilicon and the oxide layer to the top of the trench. U.S. Pat. No. 5,880,007 to Varian et al discloses another process to form STI. An HDP oxide is deposited to completely fill the trenches. A polysilicon layer is deposited overlying the oxide layer. The polysilicon is deposited so that the top surface of the polysilicon overlying the trenches is higher than the top surface of the oxide layer over the non-trench (higher) areas. A CMP is performed to expose the oxide. The exposed oxide is etched down. The polysilicon is etched away. A second CMP is performed to polish down the oxide to the top of the trenches. U.S. Pat. No. 5,792,707 to Chung teaches a process to planarize interlevel dielectrics. A photolithography step is used to define areas where the interlevel oxide will be protected from etching and polishing. U.S. Pat. No. 5,498,565 to Gocho et al discloses several STI processes.

SUMMARY OF THE INVENTION

A principal object of the present invention is to provide an effective and very manufacturable method of fabricating shallow trench isolations in the manufacture of integrated circuits.

A further object of the present invention is to provide a method to fabricate shallow trench isolations where no masking step is required in the planarization sequence.

Another further object of the present invention is to provide a method to fabricate shallow trench isolations where oxide dishing is eliminated.

Yet another further object of the present invention is to provide a method to fabricate shallow trench isolations where the final thickness of the trench oxide is better controlled.

In accordance with the objects of this invention, a new method of forming shallow trench isolations has been achieved. A semiconductor substrate is provided. A first etch stop layer is deposited overlying the semiconductor substrate. The first etch stop layer and the semiconductor substrate are etched to form trenches for planned shallow trench isolations. A gap fill layer of high density plasma oxide is deposited overlying the first etch stop layer and filling the trenches. The deposition of the gap fill layer is stopped before the planar top surface of the gap fill layer overlying the trenches reaches the level of the top surface of the first etch stop layer bordering the trenches. The gap fill layer is etched so that the gap fill layer overlying the trenches does not contact the gap fill layer overlying the first etch stop layer. A second etch stop layer is deposited overlying the gap fill layer and the first etch stop layer. The deposition of the second etch stop layer is stopped before the planar top surface of the second etch stop layer overlying the trenches reaches the level of the top surface of the first etch stop layer. The second etch stop layer is polished down to selectively expose the gap fill layer in areas not overlying the trenches. The exposed gap fill layer is etched away. The second etch stop layer and the first etch stop layer are etched away, and the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of shallow trench isolation structures. It should be clear to those experienced in the art that the present invention can be applied and extended without deviating from the scope of the present invention.

Figure 6:
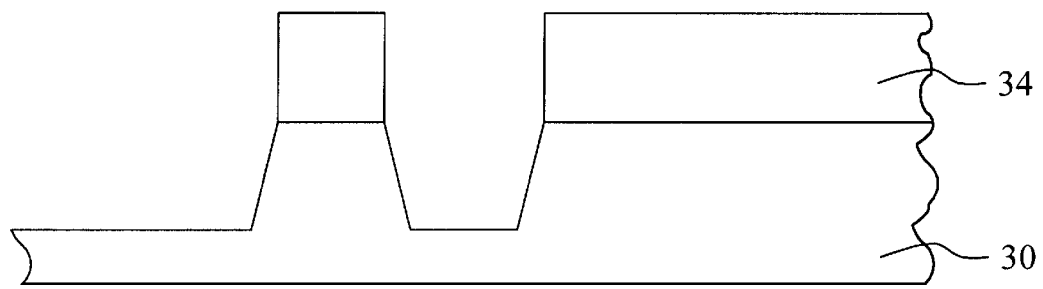
FIGS. 6 through 12 schematically illustrate in cross-sectional representation the preferred embodiment of the present invention.

Referring now particularly to FIG. 6, there is shown a cross section of a partially completed integrated circuit device of the preferred embodiment. A semiconductor substrate 30, typically consisting of monocrystalline silicon, is provided. A first etch stop layer 34 is deposited overlying the semiconductor substrate 30. The first etch stop layer 34 acts as a stop for the subsequent etching of the gap fill layer. The first etch stop layer 34 is preferably comprised of silicon nitride deposited by low-pressure chemical vapor deposition (LPCVD). The first etch stop layer 34 is deposited to a thickness of between about 1,500 Angstroms and 2,500 Angstroms.

The first etch stop layer 34 and the semiconductor substrate 30 are etched to form trenches for planned shallow trench isolations. The trenches are etched using a conventional etching process such as reactive ion etching (RIE).

Figure 7:
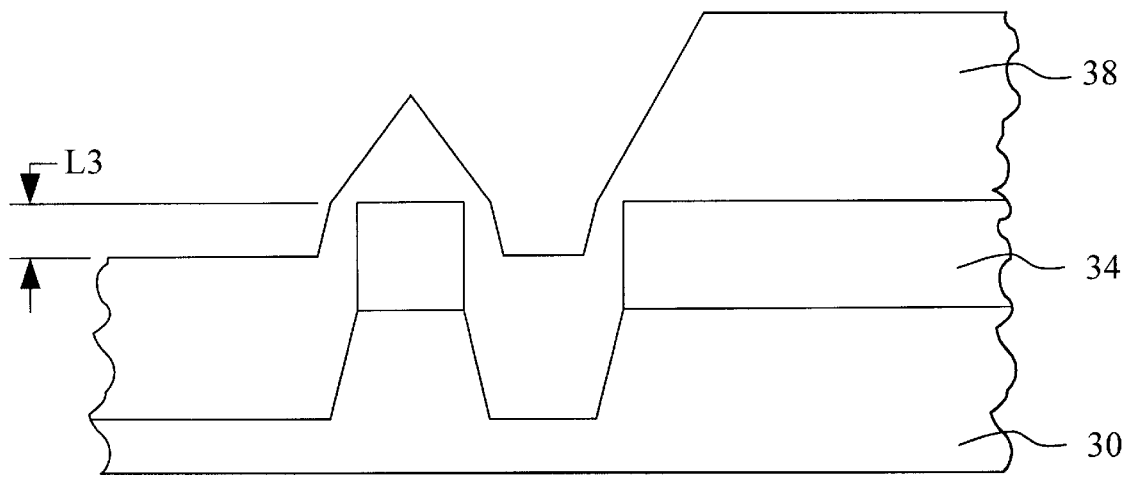

Referring now to FIG. 7, an important aspect of the present invention is shown. A gap fill layer 38 of high density plasma (HDP) oxide is deposited overlying the first etch stop layer 34 and filling the trenches. HDP oxide is used because of the excellent gap filling properties of this process. In an HDP plasma process, the silicon dioxide material is deposited and etched simultaneously in the same reaction. This process causes the silicon dioxide to be deposited very densely and with no voids. In addition, the etching process causes the HDP oxide to assume the near 45 degree angle profile at trench corners as shown in the illustration. In addition, a densification step is performed. The gap fill layer is deposited to a thickness of between about 3,000 Angstroms and 5,000 Angstroms.

Note especially, that, in the present invention, the deposition of the gap fill layer 38 is stopped before the planar top surface of the gap fill layer 38 overlying the trenches reaches the level of the top surface of the first etch stop layer 34 bordering the trenches. The planar top surface of the gap fill layer 38 is below the top surface of the first etch stop layer 34 bordering the trenches by L3 which is between about 500 Angstroms and 1,500 Angstroms. This is a key feature of the present invention because it allows the highest topography of the gap fill layer 38 to be planarized without effecting the gap fill layer 38 in the lower topography.

Figure 8:
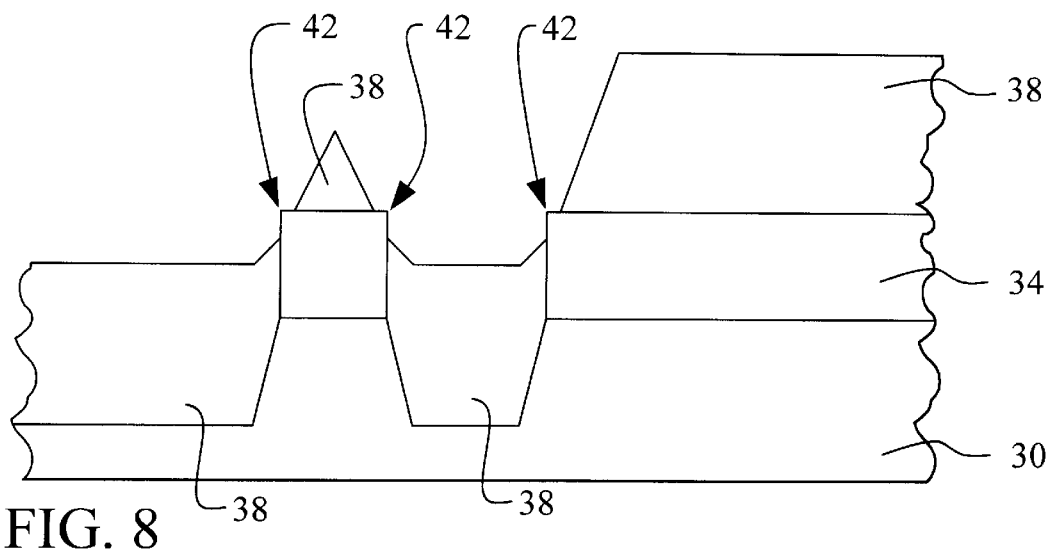

Referring now to FIG. 8, another important feature of the present invention is shown. The gap fill layer 38 is etched such that the gap fill layer 38 overlying the trenches does not contact the gap fill layer 38 overlying the first etch stop layer 34. This is important because the processing on the gap fill layer 38 above the first etch stop layer 34 can be separated from the processing of the gap fill layer 38 overlying the trenches. The gap fill layer 38 is etched using a short hydrofluoric acid (HF) dip. This etch exposes the edges 42 of the etch stop layer 34 bordering the trenches. Because this is a relatively short etch, it is very controllable and removes only a small amount of the gap fill layer 38 overlying the trenches.

Figure 9:
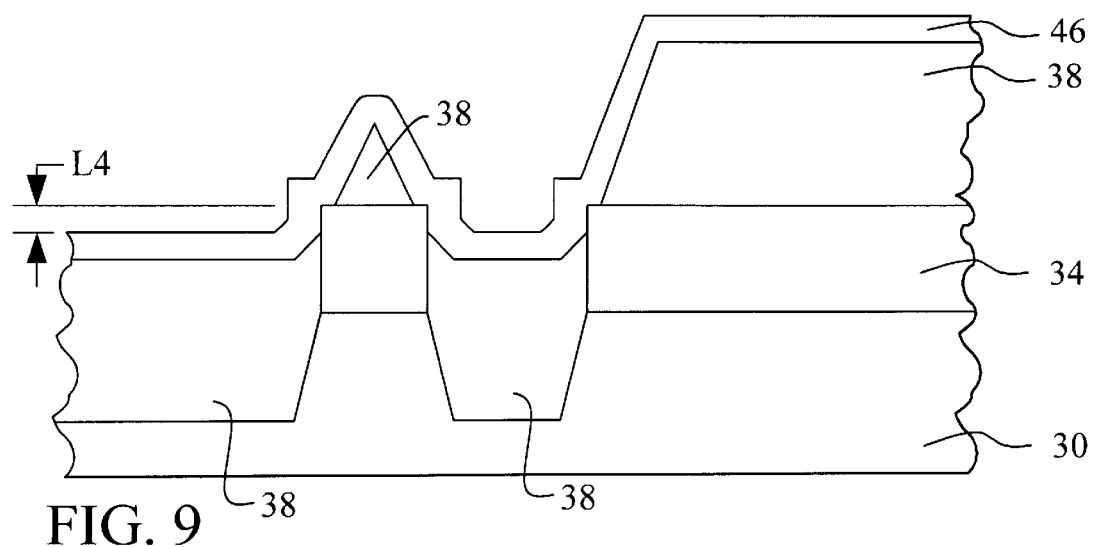

Referring now to FIG. 9, another important feature of the present invention is shown. A second etch stop layer 46 is deposited overlying the gap fill layer 38 and the first etch stop layer 34. The purpose of the second etch stop layer 46 is to protect the gap fill layer 38 overlying the trenches. The second etch stop layer 46 preferably comprises silicon nitride deposited using a low-pressure chemical vapor deposition (LPCVD). The second etch stop layer 46 is deposited to a thickness of between about 250 Angstroms and 750 Angstroms.

In addition, the deposition of the second etch stop layer 46 is stopped before the planar top surface of the second etch stop layer 46 overlying the trenches reaches the level of the top surface of the first etch stop layer 34. By keeping the top surface of the second etch stop layer 46 below the top surface of the first etch stop layer 34, the gap fill layer 38 in the trenches can be isolated from the planarization processing for the gap fill layer 38 overlying the first etch stop layer 34. Typically, the top surface of the second etch stop layer 46 is below the top surface of the first etch stop layer 34 by L4 which is between about 200 Angstroms and 1,500 Angstroms.

Figure 10:
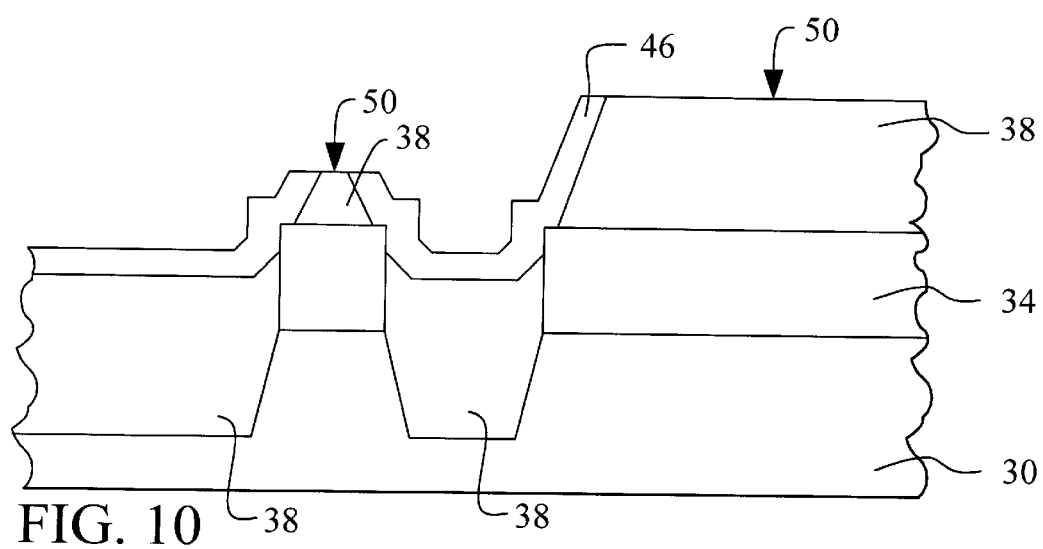

Referring now to FIG. 10, another important feature of the present invention is shown. The second etch stop layer 46 is polished down to selectively expose the gap fill layer 38 in areas not overlying the trenches as shown by 50. The polish down is performed by a conventional chemical mechanical polish (CMP) that is short and is optimized to break through the second etch stop layer 46.

Figure 11:
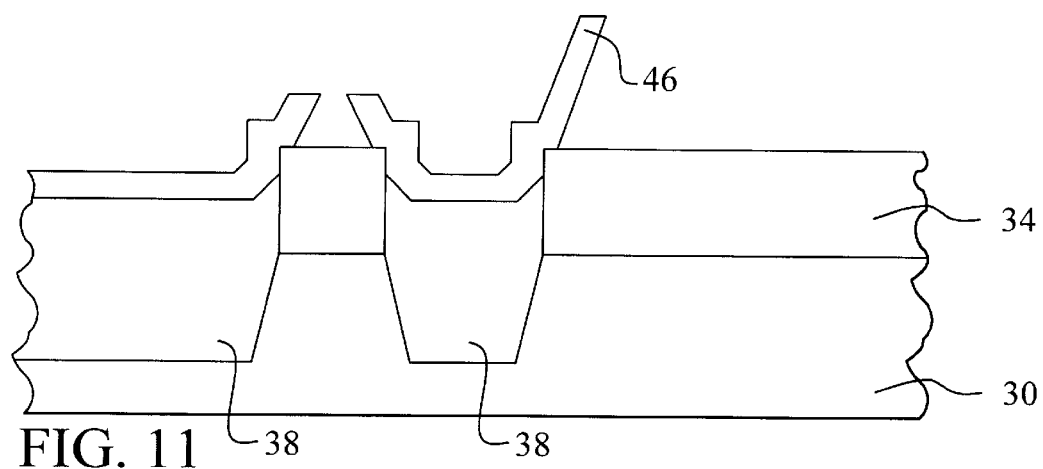

Referring now to FIG. 11, the exposed gap fill layer 38 is etched away. The second etch stop layer 46 protects the gap fill layer 38 in the trenches during the etch of the gap fill layer 38. The etch is performed using an hydrofluoric acid (HF) dip.

Figure 12:
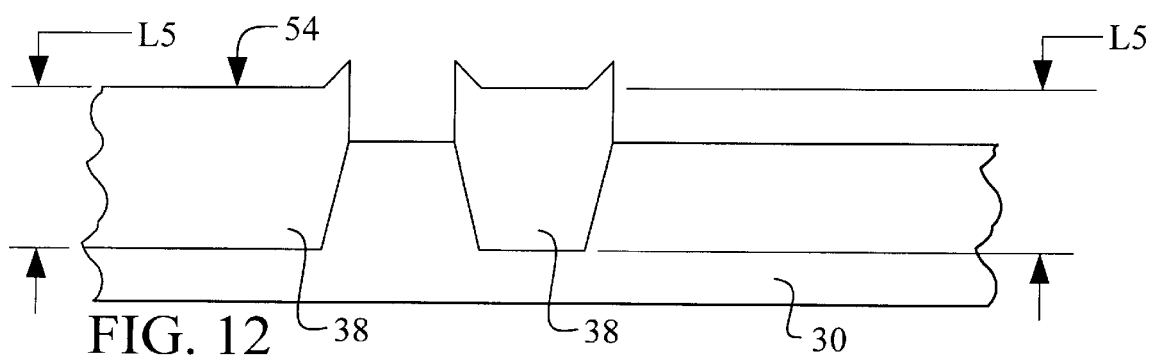

Referring now to FIG. 12, the second etch stop layer 46 and the first etch stop layer 34 are etched away, and the integrated circuit device is completed. This etching step is preferably performed using a hot phosphoric acid ($H_3PO_4$) that will remove the first etch stop layer 34 and the second etch stop layer 46 without etching the gap fill layer 38. The etching step leaves the gap fill layer formed to a well-controlled thickness L5. In addition no dishing 54 of the gap fill layer below the substrate 30 top surface occurs.

Figure 1:
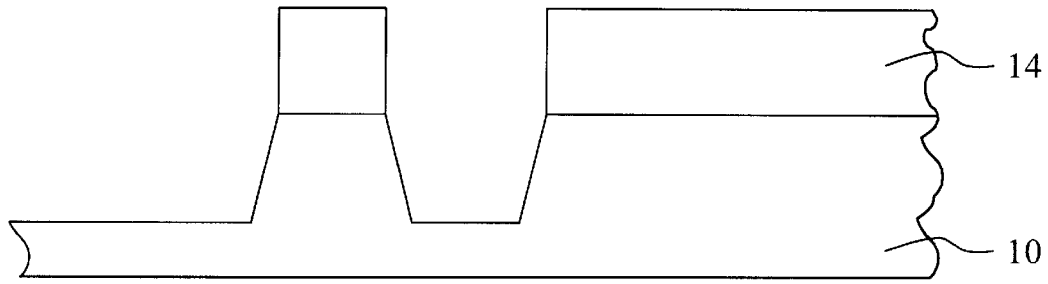
FIGS. 1 through 5 schematically illustrate in cross-section a partially completed prior art integrated circuit device.
Figure 2:
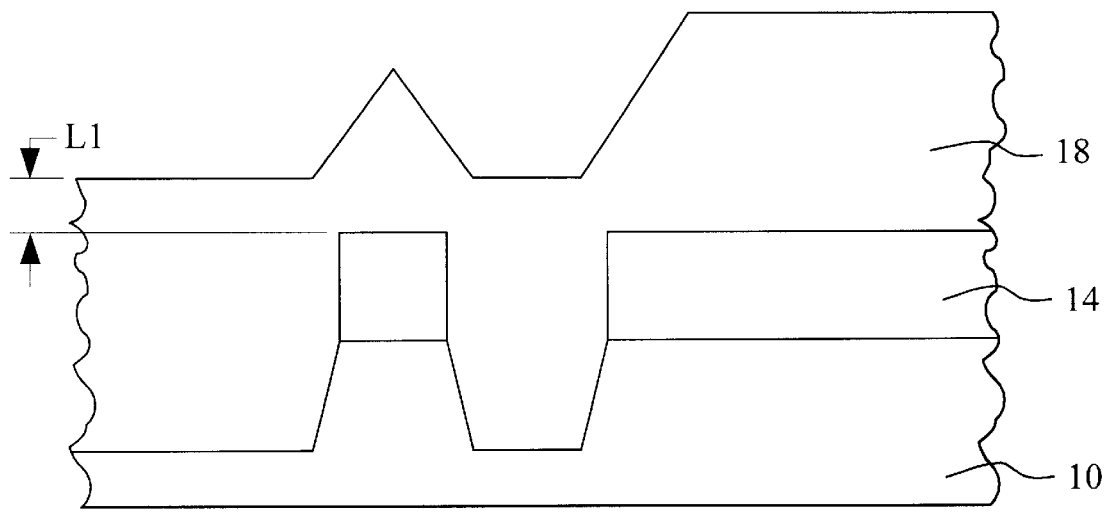
Figure 3:
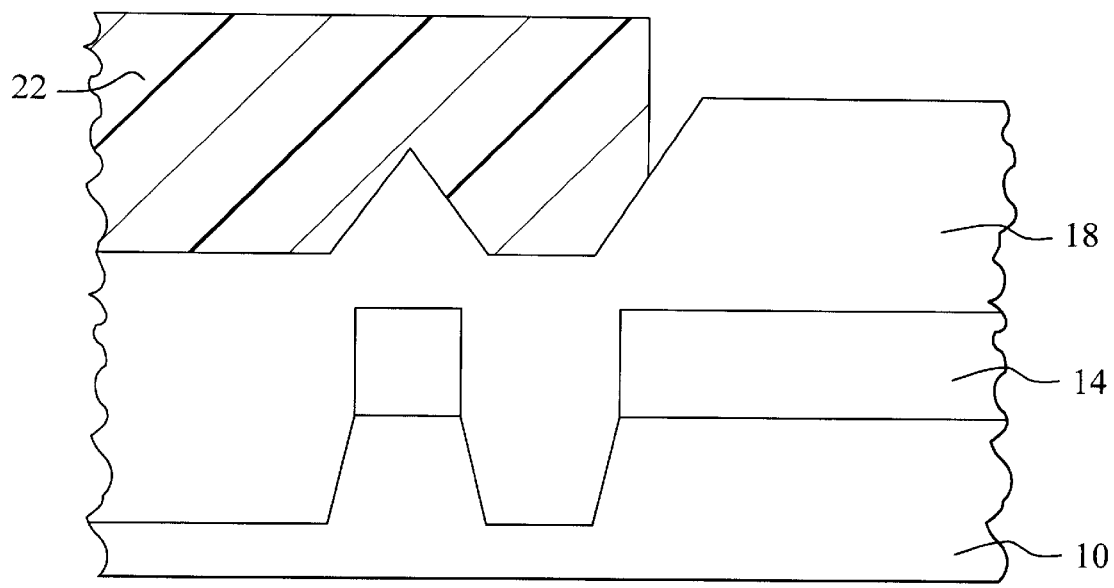
Figure 4:
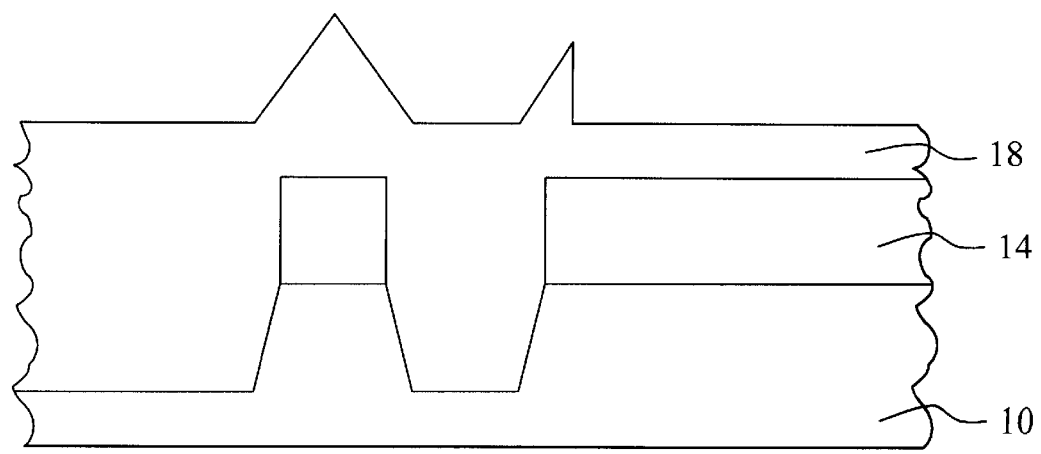
Figure 5:
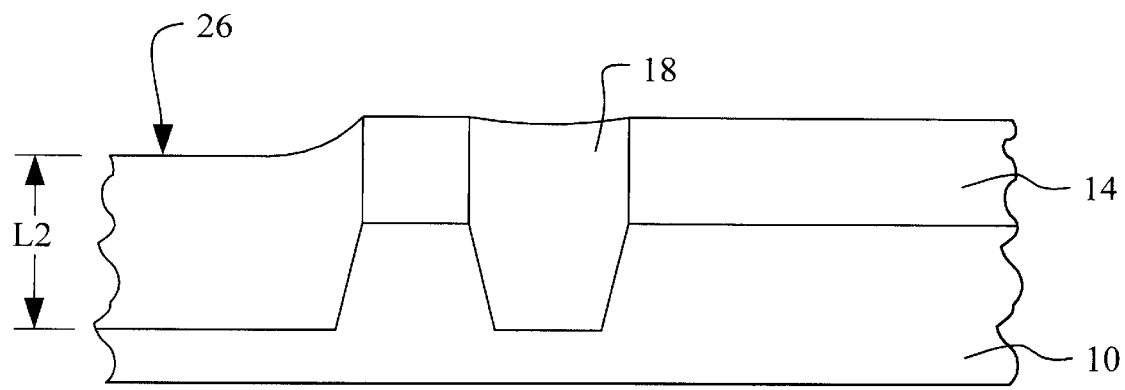

Now the advantages of the present invention, when compared to the prior art of, for example, FIG. 5, can be demonstrated. No dishing 54 of gap fill layer 38 is seen in the large isolation areas following the CMP step. In addition, the height of the remaining gap fill layer 38 is well controlled as shown by L5. This dimension L5 is not dependent upon the STI oxide CMP process. Finally, the novel approach of the present invention eliminates the need for a masking step and etch back step (refer to FIG. 3 and FIG. 4, respectively, of the prior art analysis). The elimination of the masking step and the etch back step simplifies the process significantly.

As shown in the preferred embodiments, the present invention provides a very manufacturable process for fabricating shallow trench isolation in an integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method to fabricate shallow trench isolations in the manufacture of an integrated circuit device comprising:
providing a semiconductor substrate;
depositing a first etch stop layer overlying said semiconductor substrate;
etching said first etch stop layer and said semiconductor substrate to form trenches;
depositing a gap fill layer overlying said first etch stop layer and filling said trenches wherein said depositing is stopped before the planar top surface of said gap fill layer overlying said trenches reaches the level of the top surface of said first etch stop layer bordering said trenches;
etching said gap fill layer so that said gap fill layer overlying said trenches does not contact said gap fill layer overlying said first etch stop layer;
depositing a second etch stop layer overlying said gap fill layer and said first etch stop layer wherein said depositing is stopped before the planar top surface of said second etch stop layer overlying said trenches reaches the level of said top surface of said first etch stop layer;
polishing down said second etch stop layer to selectively expose said gap fill layer in areas not overlying said trenches;
etching away said exposed gap fill layer; and
etching away said second etch stop layer and said first etch stop layer to complete fabrication of said shallow trench isolations in the manufacture of said integrated circuit device.

2. The method according to claim 1 wherein said first etch stop layer comprises silicon nitride.

3. The method according to claim 1 wherein said first etch stop layer is deposited to a thickness of between about 1,500 Angstroms and 2,500 Angstroms.

4. The method according to claim 1 wherein said gap fill layer comprises high density plasma (HDP) oxide.

5. The method according to claim 1 wherein said gap fill layer is deposited to a thickness of between about 3,000 Angstroms and 5,000 Angstroms.

6. The method according to claim 1 wherein said top surface of said gap fill layer overlying said trenches is between about 500 Angstroms and 1,500 Angstroms below the level of the top surface of said first etch stop layer bordering said trenches.

7. The method according to claim 1 wherein said second etch stop layer comprises silicon nitride.

8. The method according to claim 1 wherein said second etch stop layer is deposited to a thickness of between about 250 Angstroms and 750 Angstroms.

9. The method according to claim 1 wherein said planar top surface of said second etch stop layer overlying said trenches is between about 200 Angstroms and 1,500 Angstroms below the level of said top surface of said first etch stop layer.

10. The method according to claim 1 wherein said step of polishing down said second etch stop layer to selectively expose said gap fill layer is by chemical mechanical polishing.

11. A method to fabricate shallow trench isolations in the manufacture of an integrated circuit device comprising:
providing a semiconductor substrate;
depositing a first etch stop layer overlying said semiconductor substrate wherein said first etch stop layer comprises silicon nitride;
etching said first etch stop layer and said semiconductor substrate to form trenches;
depositing a gap fill layer overlying said first etch stop layer and filling said trenches wherein said depositing is stopped before the planar top surface of said gap fill layer overlying said trenches reaches the level of the top surface of said first etch stop layer bordering said trenches and wherein said gap fill layer comprises high density plasma (HDP) oxide;
etching said gap fill layer so that said gap fill layer overlying said trenches does not contact said gap fill layer overlying said first etch stop layer;
depositing a second etch stop layer overlying said gap fill layer and said first etch stop layer wherein said depositing is stopped before the planar top surface of said second etch stop layer overlying said trenches reaches the level of said top surface of said first etch stop layer wherein said second etch stop layer comprises silicon nitride;
polishing down said second etch stop layer to selectively expose said gap fill layer in areas not overlying said trenches;
etching away said exposed gap fill layer; and
etching away said second etch stop layer and said first etch stop layer to complete fabrication of said shallow trench isolations in the manufacture of said integrated circuit device.

12. The method according to claim 11 wherein said first etch stop layer is deposited to a thickness of between about 1,500 Angstroms and 2,500 Angstroms.

13. The method according to claim 11 wherein said gap fill layer is deposited to a thickness of between about 3,000 Angstroms and 5,000 Angstroms.

14. The method according to claim 11 wherein said top surface of said gap fill layer overlying said trenches is between about 500 Angstroms and 1,500 Angstroms below the level of the top surface of said first etch stop layer bordering said trenches.

15. The method according to claim 11 wherein said second etch stop layer is deposited to a thickness of between about 250 Angstroms and 750 Angstroms.

16. The method according to claim 11 wherein said planar top surface of said second etch stop layer overlying said trenches is between about 200 Angstroms and 1,500 Angstroms below the level of said top surface of said first etch stop layer.

17. A method to fabricate shallow trench isolations in the manufacture of an integrated circuit device comprising:

providing a semiconductor substrate;

depositing a first etch stop layer overlying said semiconductor substrate wherein said first etch stop layer comprises silicon nitride;

etching said first etch stop layer and said semiconductor substrate to form trenches;

depositing a gap fill layer overlying said first etch stop layer and filling said trenches wherein said depositing forms the planar top surface of said gap fill layer overlying said trenches between about 500 Angstroms and 1,500 Angstroms below the level of the top surface of said first etch stop layer bordering said trenches and wherein said gap fill layer comprises high density plasma (HDP) oxide;

etching said gap fill layer so that said gap fill layer overlying said trenches does not contact said gap fill layer overlying said first etch stop layer;

depositing a second etch stop layer overlying said gap fill layer and said first etch stop layer wherein said depositing is forms the planar top surface of said second etch stop layer overlying said trenches between about 200 Angstroms and 1,500 Angstroms below the level of said top surface of said first etch stop layer wherein said second etch stop layer comp rises silicon nitride;

polishing down said second etch stop layer to selectively expose said gap fill layer in areas not overlying said trenches;

etching away said exposed gap fill layer; and etching away said second etch stop layer and said first etch stop layer to complete fabrication of said shallow trench isolations in the manufacture of said integrated circuit device.

18. The method according to claim 17 wherein said first etch stop layer is deposited to a thickness of between about 1,500 Angstroms and 2,500 Angstroms.

19. The method according to claim 17 wherein said gap fill layer is deposited to a thickness of between about 3,000 Angstroms and 5,000 Angstroms.

20. The method according to claim 11 wherein said second etch stop layer is deposited to a thickness of between about 250 Angstroms and 750 Angstroms.

\* \* \* \* \*